(12) United States Patent
Xue et al.

(10) Patent No.: US 12,471,325 B2
(45) Date of Patent: Nov. 11, 2025

(54) TRANSISTOR STRUCTURE, SEMICONDUCTOR STRUCTURE AND FABRICATION METHOD THEREOF

(71) Applicant: CHANGXIN MEMORY TECHNOLOGIES, INC., Hefei (CN)

(72) Inventors: Hui Xue, Hefei (CN); Wentao Xu, Hefei (CN); Yutong Shen, Hefei (CN); Inho Park, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 520 days.

(21) Appl. No.: 17/844,061

(22) Filed: Jun. 20, 2022

(65) Prior Publication Data

US 2022/0352361 A1 Nov. 3, 2022

Related U.S. Application Data

(63) Continuation of application No. PCT/CN2021/113004, filed on Aug. 17, 2021.

(30) Foreign Application Priority Data

Apr. 30, 2021 (CN) .......................... 202110483852.0

(51) Int. Cl.
*H10D 48/36* (2025.01)
*H10D 84/82* (2025.01)
*H10D 99/00* (2025.01)

(52) U.S. Cl.
CPC ........... *H10D 48/362* (2025.01); *H10D 84/82* (2025.01); *H10D 99/00* (2025.01)

(58) Field of Classification Search
None
See application file for complete search history.

(56) References Cited

U.S. PATENT DOCUMENTS

| 8,669,591 B2* | 3/2014 | Marino | ................ H10D 64/517 |
| | | | 257/E29.246 |
| 2004/0099966 A1* | 5/2004 | Chau | .................... H10D 30/675 |
| | | | 257/E29.147 |

(Continued)

FOREIGN PATENT DOCUMENTS

| CN | 103972296 A | 8/2014 |
| CN | 107275218 A | 10/2017 |

(Continued)

OTHER PUBLICATIONS

Machine translation of CN107919388 (A) (Year: 2018).*

(Continued)

*Primary Examiner* — Bilkis Jahan
(74) *Attorney, Agent, or Firm* — Kilpatrick Townsend & Stockton LLP

(57) ABSTRACT

Embodiments provide a transistor structure, a semiconductor structure and a fabrication method thereof. The method for fabricating a transistor structure includes: providing a substrate; forming a channel layer on an upper surface of the substrate, the channel layer including a two-dimensional layered transition metal material layer; forming a source and a drain on two opposite sides of the channel layer, respectively; forming a gate dielectric layer on the upper surface of the substrate, the gate dielectric layer covering the channel layer, the source, and the drain; and forming a gate on an (Continued)

upper surface of the gate dielectric layer, the gate being positioned at least directly above the channel layer.

15 Claims, 9 Drawing Sheets

(56) References Cited

U.S. PATENT DOCUMENTS

| | | | |
|---|---|---|---|
| 2006/0202266 A1 | 9/2006 | Radosavljevic et al. | |
| 2010/0117146 A1* | 5/2010 | Ikeda | H10D 30/475 438/270 |
| 2011/0084307 A1* | 4/2011 | Miki | H01L 21/02458 257/E33.025 |
| 2013/0161698 A1* | 6/2013 | Marino | H10D 64/517 257/E21.403 |
| 2015/0303315 A1 | 10/2015 | Das et al. | |
| 2016/0118460 A1* | 4/2016 | Pei | H10D 30/6738 257/9 |
| 2018/0040737 A1 | 2/2018 | Nam et al. | |
| 2019/0164972 A1 | 5/2019 | Peng et al. | |
| 2021/0091219 A1* | 3/2021 | Patti | H10D 30/478 |

FOREIGN PATENT DOCUMENTS

| | | |
|---|---|---|
| CN | 107919388 A | 4/2018 |
| CN | 109560125 A | 4/2019 |
| CN | 110310991 A | 10/2019 |
| CN | 104617135 B | 11/2019 |

OTHER PUBLICATIONS

European Patent Office, Extended European Search Report Issued in Application No. 21938807.1, Jan. 31, 2024, Germany, 8 pages.

Liu Wei et al. "Role of metal contacts in designing high-performance monolayer n-type WSe2 field effect transistors", Nano Letters, American Chemical Society, US, vol. 13, No. 5, 2013, pp. 1983-1990.

Kim Hee-Joong et al., "Determination of Interface and Bulk Trap Densities in High-Mobility p-type WSe2 Thin-Film Transistors", IEEE Electron Device Letters, IEEE, USA, vol. 38, No. 4, Apr. 2017, pp. 481-484.

* cited by examiner

TRANSISTOR STRUCTURE, SEMICONDUCTOR STRUCTURE AND FABRICATION METHOD THEREOF

CROSS-REFERENCE TO RELATED APPLICATION

This application is a continuation of PCT/CN2021/113004, filed on Aug. 17, 2021, which claims priority to Chinese Patent Application No. 2021104838520 titled "TRANSISTOR STRUCTURE, SEMICONDUCTOR STRUCTURE AND FABRICATION METHOD THEREOF" and filed to the State Intellectual Property Office on Apr. 30, 2021, the entire contents of which are incorporated herein by reference.

TECHNICAL FIELD

The present disclosure relates to but is not limited to a transistor structure, a semiconductor structure and fabrication method thereof.

BACKGROUND

In the field of fabrication of dynamic random access memory (DRAM), as its size continues to shrink (for example, 10 nm and below), in the pursuit of faster switching speed and lower energy consumption, how to control a short channel effect becomes particularly important. In traditional fabrication processes, generally doping technologies are used. For example, halo regions or lightly doped drain (LDD) regions are formed by means of doping to reduce the short channel effect. In addition, sources and drains also need to be formed by means of ion implantation. However, in addition to high fabrication costs, traditional doping methods often cause problems of poor device reliability during doping, such as transient enhanced diffusion of boron, PN junction leakage current, and negative bias temperature instability (NBTI), etc. In addition, when the device size further shrinks, it becomes difficult to perform uniform and effective doping.

SUMMARY

Embodiments of the present disclosure provide a method for fabricating a transistor structure, and the method includes:
  providing a substrate;
  forming a channel layer on an upper surface of the substrate, the channel layer comprising a two-dimensional layered transition metal material layer;
  forming a source and a drain on two opposite sides of the channel layer, respectively;
  forming a gate dielectric layer on the upper surface of the substrate, the gate dielectric layer covering the channel layer, the source, and the drain; and
  forming a gate on an upper surface of the gate dielectric layer, the gate being positioned at least directly above the channel layer.

The embodiments of the present disclosure also provide a method for fabricating a semiconductor structure, and the method includes:
  fabricating two transistor structures as mentioned above by means of the method for fabricating a transistor structure according to the above embodiments, the two transistor structures being respectively denoted as a first transistor structure and a second transistor structure, a material of a source and a material of a drain of the first transistor structure both comprising palladium, and a material of a source and a material of a drain of the second transistor structure both comprising titanium.

The embodiments of the present disclosure also provide a transistor structure, including: a gate, a gate dielectric layer, a source, a drain, and a channel layer.

The gate dielectric layer is positioned under the gate, and the source and the drain both are positioned under the gate dielectric layer. The channel layer is positioned under the gate dielectric layer and positioned between the source and the drain, and the channel layer comprises a two-dimensional layered transition metal material layer.

The embodiments of the present disclosure also provide a semiconductor structure, including:
  a substrate;
  two transistor structures positioned on the substrate as mentioned in the above embodiments, the two transistor structures being respectively denoted as a first transistor structure and a second transistor structure, a material of a source and a material of a drain of the first transistor structure both comprising palladium, and a material of a source and a material of a drain of the second transistor structure both comprising titanium.

BRIEF DESCRIPTION OF THE DRAWINGS

To describe the technical solutions of the embodiments of the present disclosure more clearly, the accompanying drawings required for describing the embodiments will be briefly introduced below. Apparently, the accompanying drawings in the following description are merely some embodiments of the present disclosure. To those of ordinary skills in the art, other accompanying drawings may also be derived from these accompanying drawings without creative efforts.

FIGS. 2 to 11 are schematic top views showing structures of layouts obtained in each step of the method for fabricating a transistor structure according to an embodiment of the present disclosure, wherein FIG. 10 and FIG. 11 are schematic structural diagrams of a transistor structure according to another embodiment of the present disclosure;

FIGS. 13 to 24 are schematic top views showing structures of layouts obtained in each step of the method for fabricating a semiconductor structure according to an embodiment of the present disclosure, wherein FIG. 23 and FIG. 24 are schematic structural diagrams of a semiconductor structure according to another embodiment of the present disclosure.

Figure 1:
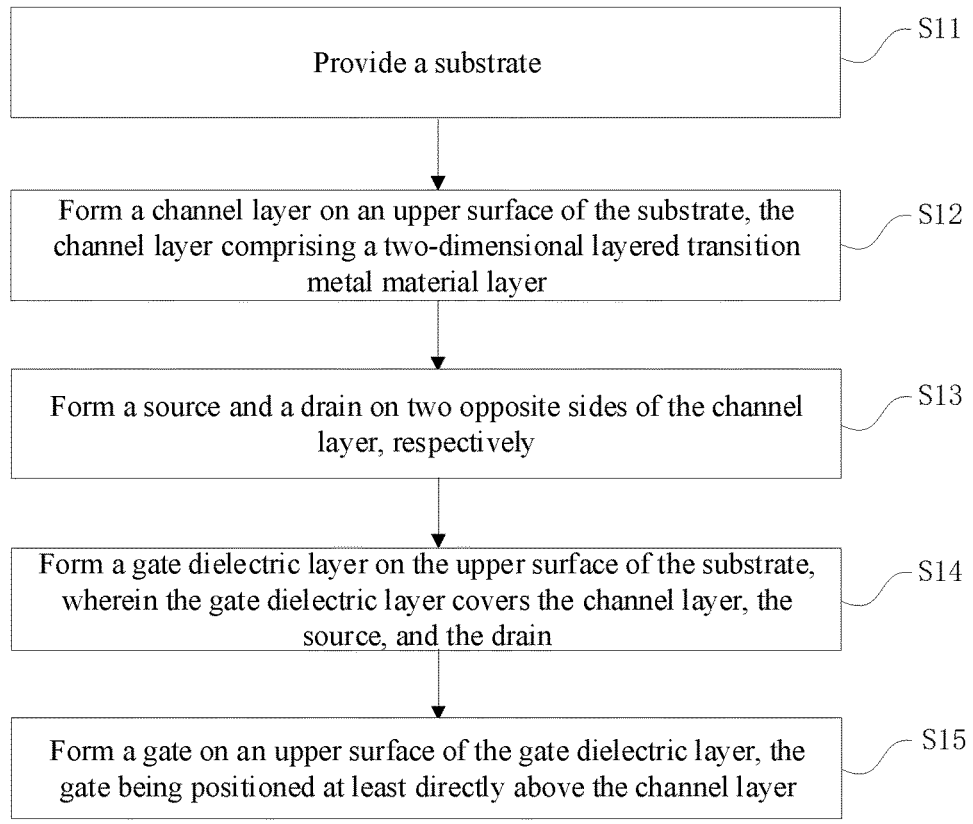
FIG. 1 is a flowchart of a method for fabricating a transistor structure according to an embodiment of the present disclosure.

Description of reference numerals: 10—substrate; 101—base; 102—dielectric layer; 11—channel layer; 111—two-dimensional layered transition metal material film layer; 112—first channel layer; 113—second channel layer; 12—source; 121—first source; 122—second source; 13—drain; 131—first drain; 132—second drain; 14—gate dielectric layer; 15—gate; 16—first patterned mask layer; and 17—second patterned mask layer.

DETAILED DESCRIPTION

For ease of understanding the present disclosure, the present disclosure will be described more fully hereinafter with reference to the accompanying drawings. Some embodiments of the present disclosure are provided in the accompanying drawings. The present disclosure may, however, be embodied in many different forms and should not be limited to the embodiments set forth herein. Rather, these embodiments are provided so that disclosed contents of the present disclosure are understood more thoroughly and completely.

Unless otherwise defined, all technical and scientific terms employed herein have the same meaning as commonly understood by one of ordinary skill in the art to which the present disclosure belongs. The terms employed in the specification of the present disclosure are merely for the purpose of describing some embodiments and are not intended for limiting the present disclosure. As used herein, the term "and/or" includes any and all combinations of one or more of the associated listed items.

In the case of "comprising", "having", and "including" as described herein, another component may be added unless a clearly defined term is used, such as "only", "consisting of", etc. Unless mentioned to the contrary, terms in the singular form may include the plural form and cannot be understood as one in number.

Referring to FIG. 1, the present disclosure provides a method for fabricating a transistor structure, including following steps:

S11: providing a substrate;
S12: forming a channel layer on an upper surface of the substrate, the channel layer comprising a two-dimensional layered transition metal material layer;
S13: forming a source and a drain on two opposite sides of the channel layer, respectively;
S14: forming a gate dielectric layer on the upper surface of the substrate, wherein the gate dielectric layer covers the channel layer, the source, and the drain; and
S15: forming a gate on an upper surface of the gate dielectric layer, the gate being positioned at least directly above the channel layer.

In the method for fabricating a transistor structure provided by the present disclosure, a two-dimensional layered transition metal material layer is formed to serve as a channel layer, such that a short channel effect can be suppressed without additional doping. In this way, a threshold voltage can be reduced, a saturation current can be increased, and reliability of a device can be improved. Furthermore, the step of ion implantation is omitted, such that the use of a photomask can be reduced, process steps can be reduced, and costs can be lowered.

Figure 2:
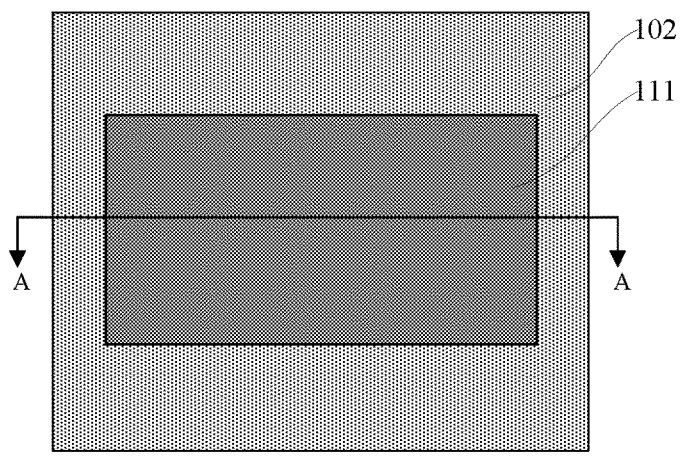
Figure 3:
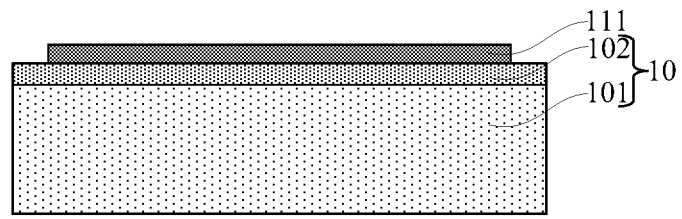

In Step S11, a substrate 10 is provided, referring to S11 in FIG. 1 and referring to FIG. 2 and FIG. 3.

In one example, the substrate 10 may include a base 101 and a dielectric layer 102 positioned on an upper surface of the base 101. In some embodiments, the substrate 10 may include, but is not limited to, a silicon substrate; and the dielectric layer 102 may include, but is not limited to, an oxide layer, such as a silicon oxide layer.

In Step S12, referring to Step S12 in FIG. 1 and referring to FIGS. 2 to 5, a channel layer 11 is formed on the upper surface of the substrate 10, wherein the channel layer 11 includes a two-dimensional layered transition metal material layer.

Figure 4:
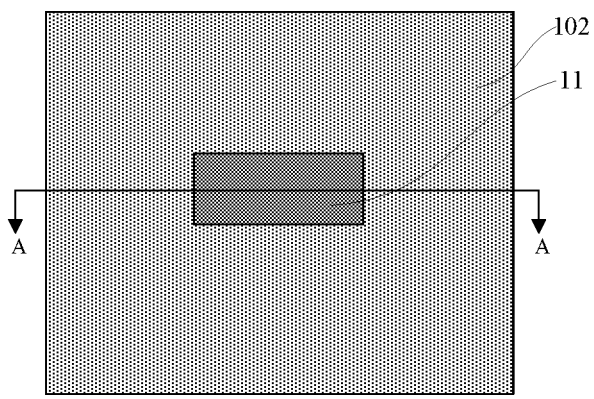
Figure 5:
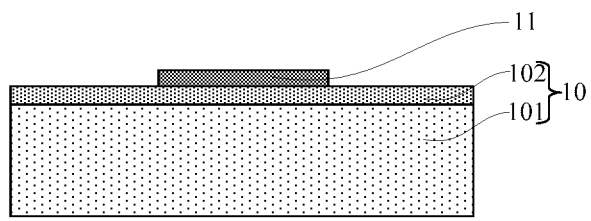

In one example, Step S12 may include following steps:
S121: forming a two-dimensional layered transition metal material film layer 111 on the upper surface of the substrate 10, as shown in FIG. 2 and FIG. 3, wherein FIG. 2 is a schematic top view of a structure obtained in Step S121, and FIG. 3 is a schematic cross-sectional structure view along a direction AA in FIG. 2; in some embodiments, the two-dimensional layered transition metal material film layer 111 may be formed by means of, but not limited to, a wet transfer process; and S122: patterning the two-dimensional layered transition metal material film layer 111 to obtain the channel layer 11, as shown in FIG. 4 and FIG. 5, wherein FIG. 4 is a schematic top view of the structure obtained in Step S122, and FIG. 5 is a schematic cross-sectional structure view along a direction AA in FIG. 4; in some embodiments, the two-dimensional layered transition metal material film layer 111 may be patterned by means of, but not limited to, a photolithography and etching process.

In one example, the two-dimensional layered transition metal material layer may include a tungsten selenide layer. That is, the channel layer 11 may include a tungsten selenide layer.

In one example, a thickness of the two-dimensional layered transition metal material layer is less than 1 nm. That is, a thickness of the channel layer 11 may be less than 1 nm, for example, 0.9 nm, 0.5 nm, 0.1 nm, and so on.

Figure 6:
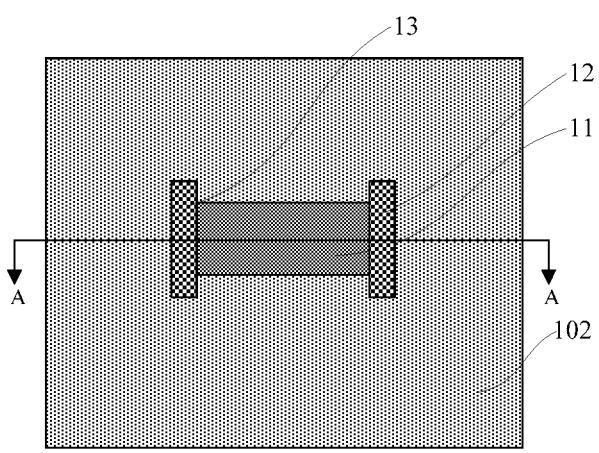
Figure 7:
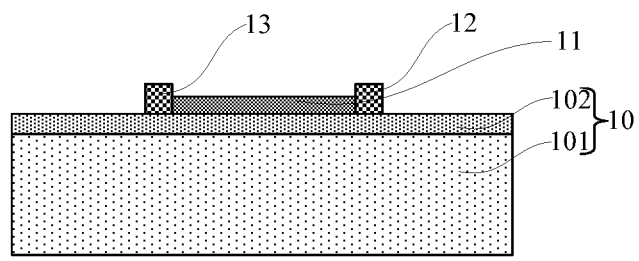

In Step S13, referring to Step S13 in FIG. 1 and referring to FIG. 6 and FIG. 7, wherein FIG. 6 is a schematic top view of the structure obtained in Step S13, and FIG. 7 is a schematic cross-sectional structure view along a direction AA in FIG. 6. A source 12 and a drain 13 are formed on two opposite sides of the channel layer 11, respectively.

In one example, a palladium layer may be respectively formed on the two opposite sides of the channel layer 11 to serve as the source 12 and the drain 13. That is, a material of the source 12 and a material of the drain 13 both include palladium. In this case, after a gate dielectric layer and a gate are subsequently formed, a P-channel metal oxide semiconductor (PMOS) transistor structure may be formed.

In another example, a titanium layer may be respectively formed on the two opposite sides of the channel layer 11 to serve as the source 12 and the drain 13. That is, a material of the source 12 and a material of the drain 13 both include titanium. In this case, after the gate dielectric layer and the gate are subsequently formed, an N-channel metal oxide semiconductor (NMOS) transistor structure may be formed.

The channel layer 11 is a two-dimensional layered transition metal material layer, so ion implantation is not required. The PMOS transistor structure or the NMOS transistor structure may be formed by contacting metals (such as the aforementioned palladium or titanium) having different work functions.

Figure 8:
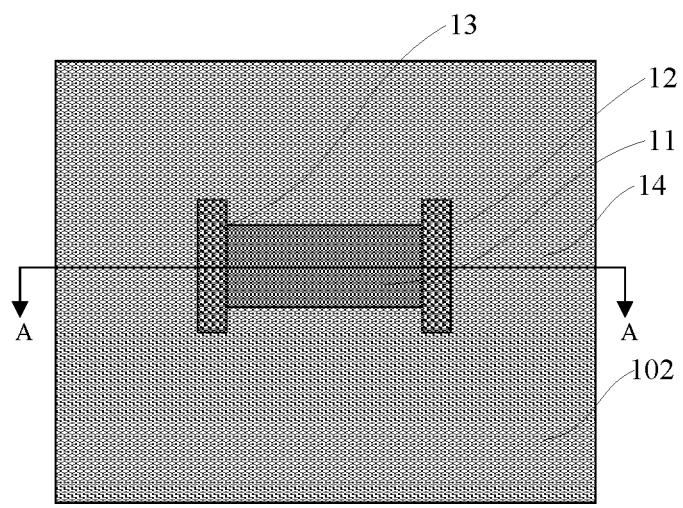
Figure 9:
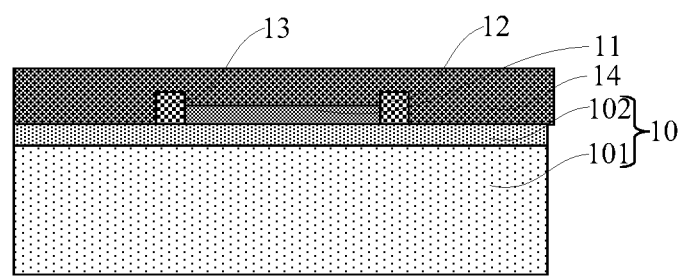

In Step S14, referring to Step S14 in FIG. 1 and referring to FIG. 8 and FIG. 9, wherein FIG. 8 is a schematic top view of the structure obtained in Step S14, and FIG. 9 is a schematic cross-sectional structure view along a direction AA in FIG. 8. A gate dielectric layer 14 is formed on the upper surface of the substrate 10, and the gate dielectric layer 14 covers the channel layer 11, the source 12, and the drain 13.

In one example, the gate dielectric layer 14 may be formed by means of, but not limited to, a deposition process.

In one example, a high-k dielectric layer may be formed on the upper surface of the substrate 10 to serve as the gate dielectric layer 14. The gate dielectric layer 14 may include, but is not limited to, a hafnium oxide layer.

In some embodiments, a thickness of the gate dielectric layer 14 may be 5 nm to 10 nm. In some embodiments, the thickness of the gate dielectric layer 14 may be 5 nm, 6 nm, 7 nm, 8 nm, 9 nm, or 10 nm.

Figure 10:
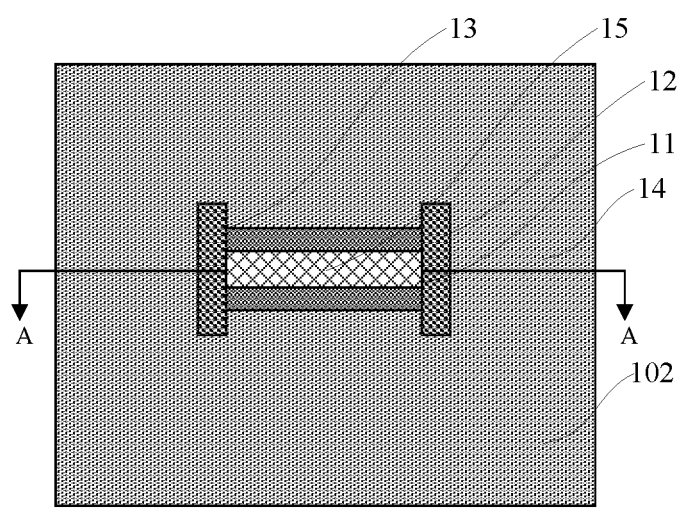
Figure 11:
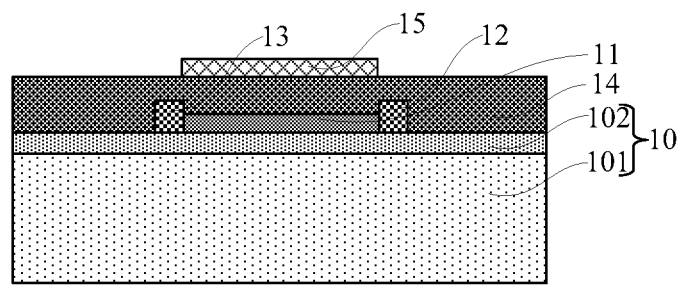

In Step S15, referring to Step S15 in FIG. 1 and referring to FIG. 10 and FIG. 11, wherein FIG. 10 is a schematic top view of the structure obtained in Step S15, and FIG. 11 is a schematic cross-sectional structure view along a direction AA in FIG. 10. A gate 15 is formed on an upper surface of the gate dielectric layer 14, and the gate 15 is positioned at least directly above the channel layer 11.

In one example, the gate 15 may include, but is not limited to, a graphene gate. In some embodiments, a single layer of graphene may be formed to serve as the gate 15 by means of wet transfer. Using the graphene as the gate 15 can avoid the use of a metal gate, such that contamination of the dielectric layer caused by the metal gate and adverse effects on electrical properties of a device caused by high-temperature annealing can be avoided.

In one example, after Step S15, the method may also include:

S16: forming a gate electrode (not shown) on an upper surface of the gate 15. In some embodiments, the gate electrode may include, but is not limited to, a metal electrode. The metal electrode may be obtained by forming a metal material layer by means of a deposition process and then patterning the metal material layer by means of photolithography and etching process. The metal electrode may also be obtained by forming a patterned mask layer that defines the metal electrode and then depositing based on the patterned mask layer. The metal electrode may include, but is not limited to, an aluminum electrode, a copper electrode, a nickel electrode, a tin electrode, and so on.

With continued reference to FIG. 10 and FIG. 11, the present disclosure also provides a transistor structure. The transistor structure includes a gate 15, a gate dielectric layer 14, a source 12, a drain 13, and a channel layer 11. The gate dielectric layer 14 is positioned below the gate 15. The source 12 and the drain 13 are positioned below the gate dielectric layer 14. The channel layer 11 is positioned under the gate dielectric layer 14 and is positioned between the source 12 and the drain 13. The channel layer 11 includes a two-dimensional layered transition metal material layer.

In the transistor structure provided by the present disclosure, the two-dimensional layered transition metal material layer serve as the channel layer 11, such that a short channel effect can be suppressed without additional doping. In this way, a threshold voltage can be reduced, a saturation current can be increased, and reliability of a device can be improved. Furthermore, the step of ion implantation is omitted, such that the use of a photomask can be reduced, process steps can be reduced, and costs can be lowered.

In some embodiments, the transistor structure in this embodiment may be fabricated by means of the method for fabricating a transistor structure in FIGS. 1 to 12.

In one example, the transistor structure is formed on a substrate 10, wherein the substrate 10 may include a base 101 and a dielectric layer 102 positioned on an upper surface of the base 101. In some embodiments, the substrate 10 may include, but is not limited to, a silicon substrate; and the dielectric layer 102 may include, but is not limited to, an oxide layer, such as a silicon oxide layer.

In one example, the two-dimensional layered transition metal material layer may include a tungsten selenide layer. That is, the channel layer 11 may include a tungsten selenide layer.

In one example, a thickness of the two-dimensional layered transition metal material layer is less than 1 nm. That is, a thickness of the channel layer 11 may be less than 1 nm, for example, 0.9 nm, 0.5 nm, 0.1 nm, and so on.

In one example, the transistor structure may include a PMOS transistor structure, and a material of the source 12 and a material of the drain 13 both include palladium.

In another example, the transistor structure may include an NMOS transistor structure, and the material of the source 12 and the material of the drain 13 both include titanium.

The channel layer 11 is a two-dimensional layered transition metal material layer, so ion implantation is not required. The PMOS transistor structure or the NMOS transistor structure may be formed by contacting metals (such as the aforementioned palladium or titanium) having different work functions.

In one example, the gate dielectric layer 14 may include a high-k dielectric layer, such as a hafnium oxide layer.

In some embodiments, a thickness of the gate dielectric layer 14 may be 5 nm to 10 nm. In some embodiments, the thickness of the gate dielectric layer 14 may be 5 nm, 6 nm, 7 nm, 8 nm, 9 nm, or 10 nm.

In one example, the gate 15 may include, but is not limited to, a graphene gate. In some embodiments, a single layer of graphene may be formed to serve as the gate 15 by means of wet transfer. Using the graphene as the gate 15 can avoid the use of a metal gate, such that contamination of the dielectric layer caused by the metal gate and adverse effects on electrical properties of a device caused by high-temperature annealing can be avoided.

In one example, the transistor structure may further include a gate electrode (not shown), which is positioned on the upper surface of the gate 15.

In some embodiments, the metal electrode may include, but is not limited to, an aluminum electrode, a copper electrode, a nickel electrode, or a tin electrode, etc.

The present disclosure also provides a method for fabricating a semiconductor structure, and this method includes:

fabricating two transistor structures as mentioned above by means of the method for fabricating a transistor structure according to any one of the above solution, the two transistor structures being respectively denoted as a first transistor structure and a second transistor structure, a material of a source and a material of a drain of the first transistor structure both comprising palladium, and a material of a source and a material of a drain of the second transistor structure both comprising titanium.

Figure 12:
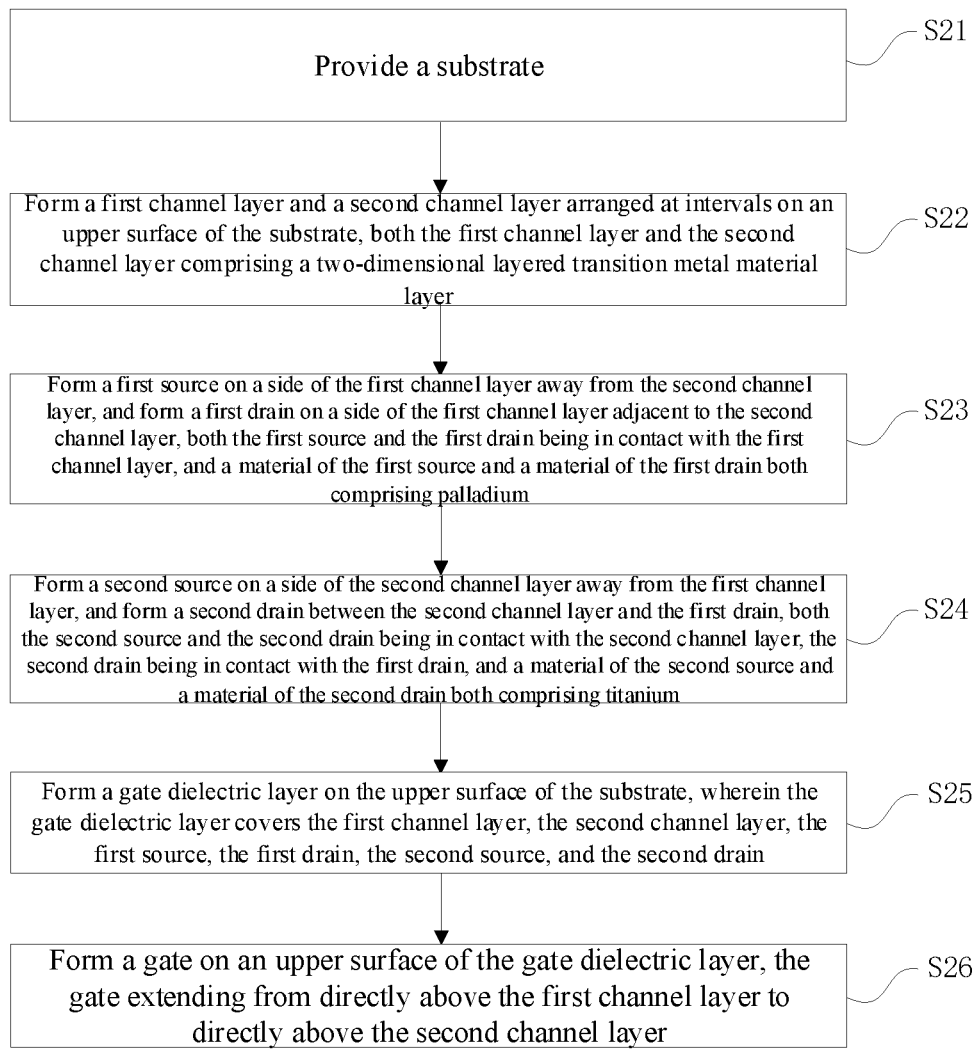
FIG. 12 is a flowchart of a method for fabricating a semiconductor structure according to another embodiment of the present disclosure.

In one example, referring to FIG. 12, fabrication of the two transistor structures includes:

S21: providing a substrate;

S22: forming a first channel layer and a second channel layer arranged at intervals on an upper surface of the substrate, both the first channel layer and the second channel layer comprising a two-dimensional layered transition metal material layer;

S23: forming a first source on a side of the first channel layer away from the second channel layer, and forming a first drain on a side of the first channel layer adjacent to the second channel layer, both the first source and the first drain being in contact with the first channel layer, and a material of the first source and a material of the first drain both comprising palladium;

S24: forming a second source on a side of the second channel layer away from the first channel layer, and forming a second drain between the second channel layer and the first drain, both the second source and the second drain being in contact with the second channel layer, the second drain being in contact with the first drain, and a material of the second source and a material of the second drain both comprising titanium;

S25: forming a gate dielectric layer on the upper surface of the substrate, wherein the gate dielectric layer covers the first channel layer, the second channel layer, the first source, the first drain, the second source, and the second drain; and S26: forming a gate on an upper surface of the gate dielectric layer, the gate extending from directly above the first channel layer to directly above the second channel layer.

The first channel layer, the first source, the first drain, the gate dielectric layer and the gate jointly constitute the first transistor structure; and the second channel layer, the second source, the second drain, the gate dielectric layer and the gate jointly constitute the second transistor structure.

In the method for fabricating a semiconductor structure provided by the present disclosure, a two-dimensional layered transition metal material layer is formed to serve as a channel layer, such that a short channel effect can be suppressed without additional doping. In this way, a threshold voltage can be reduced, a saturation current can be increased, and reliability of a device can be improved. Furthermore, the step of ion implantation is omitted, such that the use of a photomask can be reduced, process steps can be reduced, and costs can be lowered.

Figure 13:
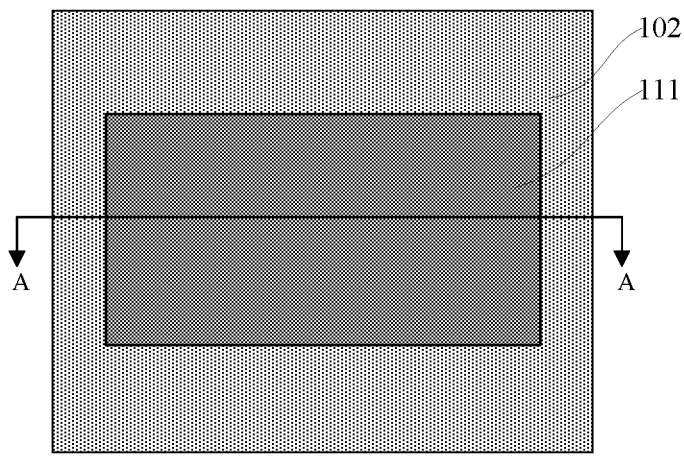
Figure 14:
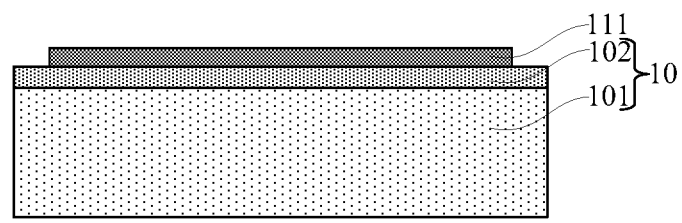

In Step S21, a substrate 10 is provided, referring to S21 in FIG. 12 and referring to FIG. 13 and FIG. 14.

In one example, the substrate 10 may include a base 101 and a dielectric layer 102 positioned on an upper surface of the base 101. In some embodiments, the substrate 10 may include, but is not limited to, a silicon substrate; and the dielectric layer 102 may include, but is not limited to, an oxide layer, such as a silicon oxide layer.

In Step S22, referring to Step S22 in FIG. 12 and referring to FIGS. 13 to 16, a first channel layer 112 and a second channel layer 113 arranged at intervals are formed on the upper surface of the substrate 10. The first channel layer 112 and the second channel layer 113 both include a two-dimensional layered transition metal material layer.

Figure 15:
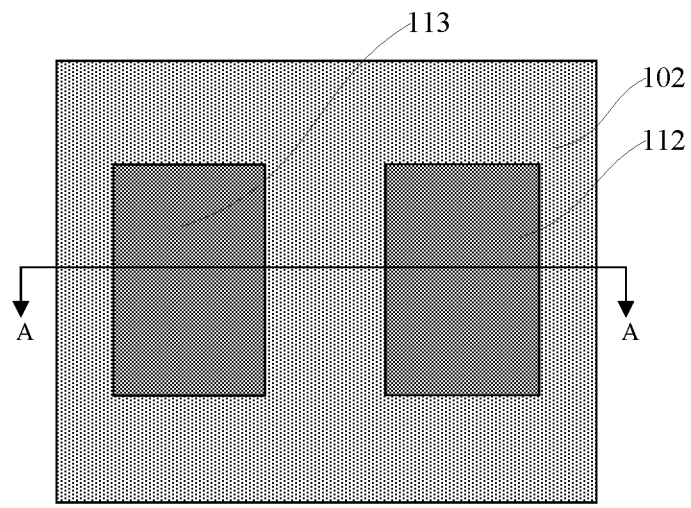
Figure 16:
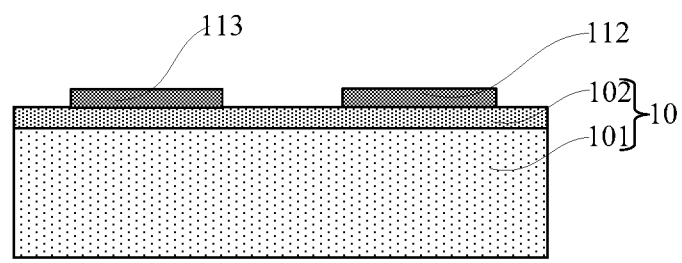

In one example, Step S22 may include:

S221: forming a two-dimensional layered transition metal material film layer 111 on the upper surface of the substrate 10, as shown in FIG. 13 and FIG. 14, wherein FIG. 13 is a schematic top view of a structure obtained in Step S221, and FIG. 14 is a schematic cross-sectional structure view along a direction AA in FIG. 13; in some embodiments, the two-dimensional layered transition metal material film layer 111 may be formed by means of, but not limited to, a wet transfer process; and S222: patterning the two-dimensional layered transition metal material film layer 111 to obtain the first channel layer 112 and the second channel layer 113, as shown in FIG. 15 and FIG. 16, wherein FIG. 15 is a schematic top view of the structure obtained in Step S222, and FIG. 16 is a schematic cross-sectional structure view along a direction AA in FIG. 15; in some embodiments, the two-dimensional layered transition metal material film layer 111 may be patterned by means of, but not limited to, a photolithography and etching process.

In one example, the two-dimensional layered transition metal material layer may include a tungsten selenide layer. That is, both the first channel layer 112 and the second channel layer 113 may include the tungsten selenide layer.

In one example, a thickness of the two-dimensional layered transition metal material layer is less than 1 nm. That is, both a thickness of the first channel layer 112 and a thickness of the second channel layer 113 may be less than 1 nm, for example, 0.9 nm, 0.5 nm, or 0.1 nm, etc.

Figure 17:
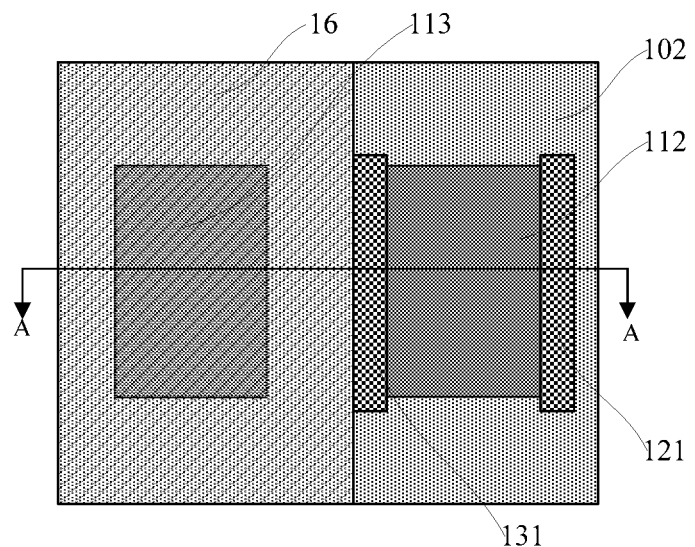
Figure 18:
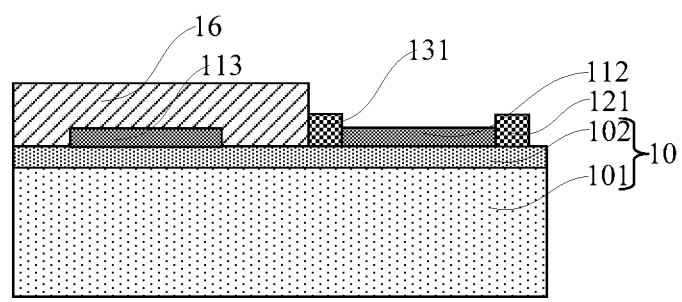

In Step S23, referring to Step S23 in FIG. 12 and referring to FIG. 17 and FIG. 18, wherein FIG. 17 is a schematic top view of the structure obtained in Step S23, and FIG. 18 is a schematic cross-sectional structure view along a direction AA in FIG. 17. A first source 121 is formed on a side of the first channel layer 112 away from the second channel layer 113, and a first drain 131 is formed on a side of the first channel layer 112 adjacent to the second channel layer 113. Both the first source 121 and the first drain 131 are in contact with the first channel layer 112. A material of the first source 121 and a material of the first drain 131 both include palladium.

In one example, Step S23 may include following steps.

S231: forming a first patterned mask layer 16 on the surface of the substrate 10, the first patterned mask layer 16 covering at least the second channel layer 113; in some embodiments, the first patterned mask layer 16 may include, but is not only limited to, a patterned photoresist layer.

S232: forming the first source 121 and the first drain 131 on the surface of the substrate 10 based on the first patterned mask layer 16.

S233: removing the first patterned mask layer 16; in some embodiments, when the first patterned mask layer 16 is the patterned photoresist layer, the first patterned mask layer 16 may be removed by means of an ashing process.

Figure 19:
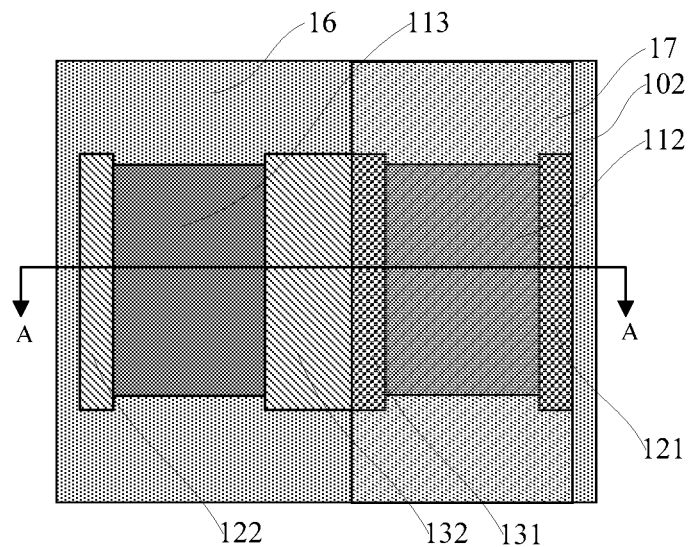
Figure 20:
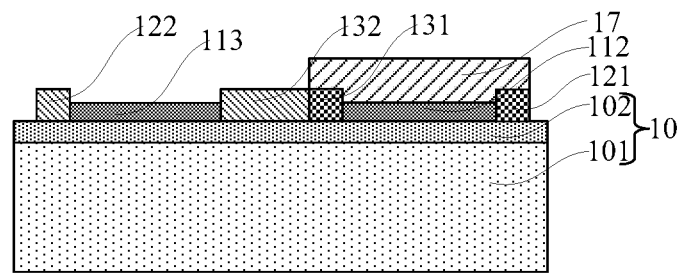

In Step S24, referring to Step S24 in FIG. 12 and referring to FIG. 19 and FIG. 20, wherein FIG. 19 is a schematic top view of a structure obtained in Step S24, and FIG. 20 is a schematic cross-sectional structure view along a direction AA in FIG. 19. A second source 122 is formed on a side of the second channel layer 113 away from the first channel layer 112, and a second drain 132 is formed between the second channel layer 113 and the first drain 131. The second source 122 and the second drain 132 are both in contact with the second channel layer 113, and the second drain 132 is in contact with the first drain 131. A material of the second source 122 and a material of the second drain 132 both include titanium.

In one example, Step S24 may include:

S241: forming a second patterned mask layer 17 on the surface of the substrate 10, wherein the second patterned mask layer 17 at least covers the first channel layer 112, the first source 121, and the first drain 131; in some embodiments, the second patterned mask layer 17 may include, but is not limited to, a patterned photoresist layer;

S242: forming the second source 122 and the second drain 132 on the surface of the substrate 10 based on the second patterned mask layer 17; and S243: removing the second patterned mask layer 17; in some embodiments, when the second patterned mask layer 17 is the patterned photoresist layer, the second patterned mask layer 17 may be removed by means of an ashing process.

Figure 21:
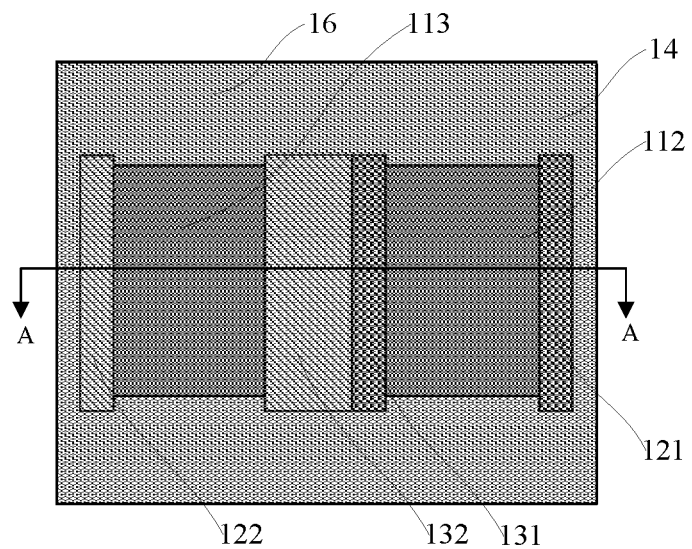
Figure 22:
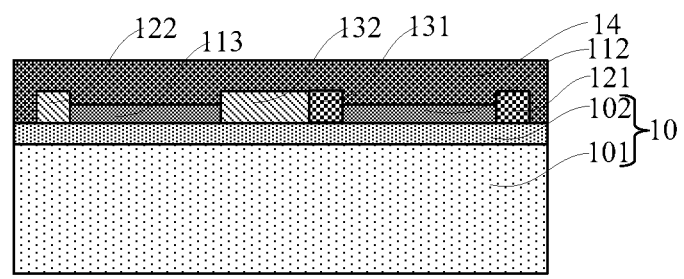

In Step S25, referring to Step S25 in FIG. 12 and referring to FIG. 21 and FIG. 22, wherein FIG. 21 is a schematic top view of the structure obtained in Step S25, and FIG. 22 is a schematic cross-sectional structure view along a direction AA in FIG. 21. A gate dielectric layer 14 is formed on the upper surface of the substrate 10, and the gate dielectric layer 14 covers the first channel layer 112, the second channel layer 113, the first source 121, the first drain 131, the second source 122, and the second drain 132.

In one example, the gate dielectric layer 14 may be formed by means of, but not limited to, a deposition process.

In one example, a high-k dielectric layer may be formed on the upper surface of the substrate 10 to serve as the gate dielectric layer 14. The gate dielectric layer 14 may include, but is not limited to, a hafnium oxide layer.

In some embodiments, a thickness of the gate dielectric layer 14 may be 5 nm to 10 nm. In some embodiments, the thickness of the gate dielectric layer 14 may be 5 nm, 6 nm, 7 nm, 8 nm, 9 nm, or 10 nm.

Figure 23:
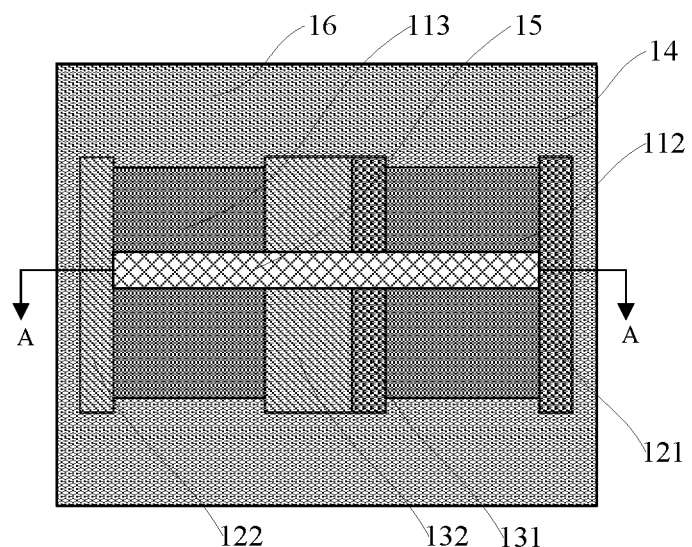
Figure 24:
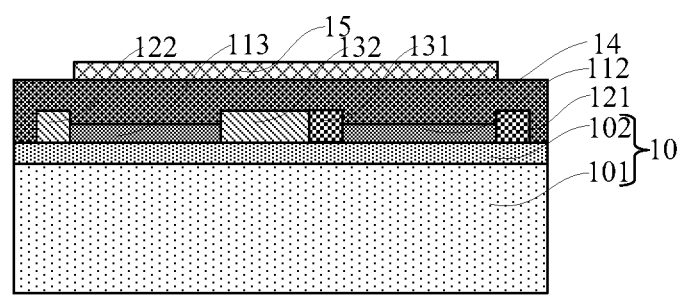

In Step S26, referring to Step S26 in FIG. 12 and referring to FIG. 23 and FIG. 24, wherein FIG. 23 is a schematic top view of the structure obtained in Step S25, and FIG. 24 is a schematic cross-sectional structure view along a direction AA in FIG. 23. A gate 15 is formed on an upper surface of the gate dielectric layer 14, and the gate 15 extends from directly above the first channel layer 112 to directly above the second channel layer 113.

In one example, the gate 15 may include, but is not limited to, a graphene gate. In some embodiments, a single layer of graphene may be formed to serve as the gate 15 by means of wet transfer. Using the graphene as the gate 15 can avoid the use of a metal gate, such that contamination of the dielectric layer caused by the metal gate and adverse effects on electrical properties of a device caused by high-temperature annealing can be avoided.

In one example, a width of the gate 15 may be smaller than that of the first channel layer 112 and that of the second channel layer 113. The gate 15 may extend from a boundary of the first channel layer 112 adjacent to the first source 121 to a boundary of the second channel layer 113 adjacent to the second source 122.

In one example, after Step S26, the method may further include:
  S27: forming a gate electrode (not shown) on an upper surface of the gate 15. In some embodiments, the gate electrode may include, but is not limited to, a metal electrode. The metal electrode may be obtained by forming a metal material layer by means of a deposition process and then patterning the metal material layer by means of photolithography and etching process. The metal electrode may also be obtained by forming a patterned mask layer that defines the metal electrode and then depositing based on the patterned mask layer. The metal electrode may include, but is not limited to, an aluminum electrode, a copper electrode, a nickel electrode, a tin electrode, and so on.

With continued reference to FIG. 23 and FIG. 24, the present disclosure also provides a semiconductor structure, which includes: a substrate 10; and two transistor structures positioned on the substrate 10 in any one of the above solutions. The two transistor structures are respectively denoted as a first transistor structure and a second transistor structure. A material of a source 12 and a material of a drain 13 of the first transistor structure both comprise palladium, and a material of the source 12 and a material of the drain 13 of the second transistor structure both comprise titanium.

In the transistor structure provided by the present disclosure, a two-dimensional layered transition metal material layer is formed to serve as a channel layer, such that a short channel effect can be suppressed without additional doping. In this way, a threshold voltage can be reduced, a saturation current can be increased, and reliability of a device can be improved. Furthermore, the step of ion implantation is omitted, such that the use of a photomask can be reduced, process steps can be reduced, and costs can be lowered.

In some embodiments, the semiconductor structure in this embodiment may be obtained by means of the method for fabricating a semiconductor structure as shown in FIGS. 12-24.

In some embodiments, the first transistor structure includes: the first channel layer 112, the first source 121, the first drain 131, the gate dielectric layer 14, and the gate 15. The second transistor structure includes: the second channel layer 113, the second source 122, the second drain 132, the gate dielectric layer 14, and the gate 15. The first transistor structure and the second transistor structure share the same gate dielectric layer 14 and share the gate 15.

In one example, the first drain 131 of the first transistor and the second drain 132 of the second transistor are positioned between the first channel layer 112 of the first transistor and the second channel layer 113 of the second transistor, and the first drain 131 and the second drain 132 are adjacent to each other.

Technical features of the above embodiments may be arbitrarily combined. For simplicity, all possible combinations of the technical features in the above embodiments are not described. However, as long as the combination of these technical features is not contradictory, it shall be deemed to be within the scope recorded in this specification.

The above embodiments merely express a plurality of implementations of the present disclosure, and descriptions thereof are relatively concrete and detailed. However, these embodiments are not thus construed as limiting the patent scope of the present disclosure. It is to be pointed out that for persons of ordinary skill in the art, some modifications and improvements may be made under the premise of not departing from a conception of the present disclosure, which shall be regarded as falling within the scope of protection of the present disclosure. Thus, the scope of protection of the present disclosure shall be subject to the appended claims.

What is claimed is:

1. A method for fabricating a transistor structure, comprising:
  providing a substrate;
  forming a channel layer on an upper surface of the substrate, the channel layer comprising a two-dimensional layered transition metal material layer;
  forming a source and a drain on two opposite sides of the channel layer, respectively;
  forming a gate dielectric layer on the upper surface of the substrate, the gate dielectric layer covering the channel layer, the source, and the drain; and
  forming a gate on an upper surface of the gate dielectric layer, the gate being positioned at least directly above the channel layer;
  wherein a high-k dielectric layer is formed on the upper surface of the substrate to serve as the gate dielectric layer, a graphene layer being formed on the upper surface of the gate dielectric layer to serve as the gate.

2. The method for fabricating a transistor structure according to claim 1, wherein the two-dimensional layered transition metal material layer comprises a tungsten selenide layer, a thickness of the two-dimensional layered transition metal material layer being less than 1 nm.

3. The method for fabricating a transistor structure according to claim 1, wherein a material of the source and a material of the drain both comprise palladium, or the material of the source and the material of the drain both comprise titanium.

4. The method for fabricating a transistor structure according to claim 1, further comprising: forming a gate electrode on an upper surface of the gate after the gate is formed on the upper surface of the gate dielectric layer.

5. A method for fabricating a semiconductor structure, comprising:
fabricating two transistor structures as mentioned above by means of the method for fabricating a transistor structure according to claim 1, the two transistor structures being respectively denoted as a first transistor structure and a second transistor structure, a material of a source and a material of a drain of the first transistor structure both comprising palladium, and a material of a source and a material of a drain of the second transistor structure both comprising titanium;
wherein fabricating two transistor structures comprises:
providing a substrate;
forming a first channel layer and a second channel layer arranged at intervals on the upper surface of the substrate, both the first channel layer and the second channel layer comprising a two-dimensional layered transition metal material layer;
forming a first source on a side of the first channel layer away from the second channel layer, and forming a first drain on a side of the first channel layer adjacent to the second channel layer, both the first source and the first drain being in contact with the first channel layer, and a material of the first source and a material of the first drain both comprising palladium;
forming a second source on a side of the second channel layer away from the first channel layer, and forming a second drain between the second channel layer and the first drain, both the second source and the second drain being in contact with the second channel layer, the second drain being in contact with the first drain, and a material of the second source and a material of the second drain both comprising titanium;
forming a gate dielectric layer on the upper surface of the substrate, the gate dielectric layer covering the first channel layer, the second channel layer, the first source, the first drain, the second source, and the second drain; and
forming a gate on an upper surface of the gate dielectric layer, the gate extending from directly above the first channel layer to directly above the second channel layer;
wherein the first channel layer, the first source, the first drain, the gate dielectric layer and the gate jointly constitute the first transistor structure, and the second channel layer, the second source, the second drain, the gate dielectric layer and the gate jointly constituting the second transistor structure.

6. The method for fabricating a semiconductor structure according to claim 5, wherein the forming a first channel layer and a second channel layer arranged at intervals on the upper surface of the substrate comprises:
forming a two-dimensional layered transition metal material film layer on the surface of the substrate; and
patterning the two-dimensional layered transition metal material film layer to obtain the first channel layer and the second channel layer.

7. The method for fabricating a semiconductor structure according to claim 5, wherein the forming a first source on a side of the first channel layer away from the second channel layer, and forming a first drain on a side of the first channel layer adjacent to the second channel layer comprise:
forming a first patterned mask layer on the surface of the substrate, the first patterned mask layer covering at least the second channel layer;
forming the first source and the first drain on the surface of the substrate based on the first patterned mask layer; and
removing the first patterned mask layer.

8. The method for fabricating a semiconductor structure according to claim 5, wherein the forming a second source on a side of the second channel layer away from the first channel layer, and forming a second drain between the second channel layer and the first drain comprise:
forming a second patterned mask layer on the surface of the substrate, the second patterned mask layer covering at least the first channel layer, the first source, and the first drain;
forming the second source and the second drain on the surface of the substrate based on the second patterned mask layer; and
removing the second patterned mask layer.

9. A transistor structure, comprising: a gate, a gate dielectric layer, a source, a drain, and a channel layer, wherein
the gate dielectric layer is positioned under the gate, the source and the drain both being positioned under the gate dielectric layer, the channel layer being positioned under the gate dielectric layer and positioned between the source and the drain, and the channel layer comprising a two-dimensional layered transition metal material layer;
wherein the gate comprises a graphene gate, the gate dielectric layer comprising a high-k dielectric layer.

10. The transistor structure according to claim 9, wherein the two-dimensional layered transition metal material layer comprises a tungsten selenide layer, a thickness of the channel layer being less than 1 nm.

11. The transistor structure according to claim 9, wherein a material of the source and a material of the drain both comprise palladium, or the material of the source and the material of the drain both comprise titanium.

12. The transistor structure according to claim 9, further comprising a gate electrode, the gate electrode being positioned on an upper surface of the gate.

13. A semiconductor structure, comprising:
a substrate;
two transistor structures positioned on the substrate according to claim 11, the two transistor structures being respectively denoted as a first transistor structure and a second transistor structure, a material of a source and a material of a drain of the first transistor structure both comprising palladium, and a material of a source and a material of a drain of the second transistor structure both comprising titanium.

14. The semiconductor structure according to claim 13, wherein the drain of the first transistor and the drain of the second transistor are positioned between a channel layer of the first transistor and a channel layer of the second transistor, and are adjacent to each other.

15. The semiconductor structure according to claim 13, wherein the first transistor and the second transistor share the gate.

* * * * *